United States Patent [19]
Hung et al.

[11] Patent Number: 6,018,257
[45] Date of Patent: Jan. 25, 2000

[54] OUTPUT DRIVE CIRCUIT TOLERANT OF HIGHER VOLTAGE SIGNALS

[75] Inventors: Luong Hung, Cupertino; Gary Hom, Fremont; Corinna Chiu, Sunnyvale, all of Calif.

[73] Assignee: LSI Logic Corporation, Milpitas, Calif.

[21] Appl. No.: 09/046,781

[22] Filed: Mar. 23, 1998

[51] Int. Cl.[7] .................................................. H03B 1/00
[52] U.S. Cl. .............................. 327/112; 326/58; 326/86
[58] Field of Search .................................. 326/56, 57, 58, 326/80, 81, 86; 327/108, 109, 110, 111, 112, 319, 333, 534

[56] References Cited

U.S. PATENT DOCUMENTS

| 5,378,943 | 1/1995 | Dennard ..................................... 326/68 |
| 5,751,179 | 5/1998 | Pietruszynski et al. ................ 327/379 |

*Primary Examiner*—Jeffrey Zweizig

[57] ABSTRACT

An output drive circuit enables both 5V and 3V devices to be connected to the same bus, without exposing the 3V devices to damage from the 5V signals on the bus. The 3V devices utilize 3V output drives that are tolerant of the 5V signals on the bus. The tolerance is achieved by a circuit design which adjusts internal voltages depending upon the external voltage on the bus. The internal voltage adjustments prevent transistor voltage limits from being exceeded and hence prevent damage from occurring.

9 Claims, 5 Drawing Sheets

OUTPUT DRIVE CIRCUIT TOLERANT OF HIGHER VOLTAGE SIGNALS

FIELD OF THE INVENTION

This invention pertains to the field of microelectronic circuits for driving output signals.

BACKGROUND OF THE INVENTION

The PCI (Peripheral Component Interconnect) bus is a computer system bus that interconnects peripheral components. The PCI bus was developed by Intel Corporation, Santa Clara, Calif., and is an important standard in the computer industry.

PCI devices communicate with each other by sending and receiving electronic signals over the PCI bus. Some (typically older) PCI devices are designed to communicate using signals ranging up to about five volts (5V), while other (typically newer) PCI devices are designed to communicate using signals ranging up to about three volts (3V).

It is desirable to be able to connect both 5V PCI devices and 3V PCI devices to the same PCI bus. However, if both 5V and 3V PCI devices are connected to the same bus, then the 3V devices may be damaged by the 5V signals on the bus. The damage typically occurs when transistor voltage limits are exceeded within the 3V devices.

The transistor voltage limits are limitations specific to the process used to manufacture the integrated circuit (IC) device. These limitations are typically incorporated into design rules by which the IC is designed. Newer and more advanced processes typically have design rules which specify smaller ranges of acceptable transistor voltages. For example, design rules for a newer process may specify that the gate-to-source voltage (Vgs) for a transistor should not exceed 3.0 volts and that the drain-to-source voltage (Vds) for a transistor should not exceed 3.3 volts. Meanwhile, design rules for a previous process may specify that neither Vgs nor Vds should exceed 3.6 volts.

BRIEF SUMMARY OF THE INVENTION

The present invention enables both 5V and 3V devices to be connected to the same bus, without exposing the 3V devices to damage from the 5V signals on the bus. The 3V devices utilize 3V output drives that are tolerant of the 5V signals on the bus. The tolerance is achieved by a circuit design which adjusts internal voltages depending on the external voltage on the bus. The internal voltage adjustments prevent transistor voltage limits from being exceeded and hence prevent damage from occurring.

IV. DETAILED DESCRIPTION OF THE INVENTION

Figure 1:
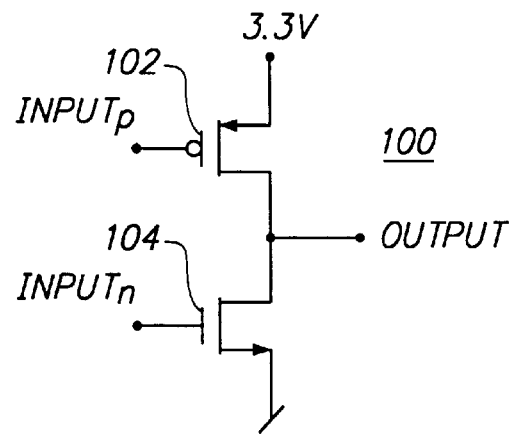
FIG. 1 is a circuit diagram of a conventional output drive circuit 100.

FIG. 1 is a circuit diagram of a conventional output drive circuit that comprises an OUTPUT node coupled to the drains of a first PMOS transistor 102 and a first NMOS transistor 104. The source of the first PMOS transistor 102 is coupled to a power source, and the source of the first NMOS transistor 104 is coupled to a ground connection. For a 3.3V output drive, the power source would supply 3.3 volts. The gate of the first PMOS transistor 102 receives an inverse version of an INPUT signal which is designated INPUTp The gate of the first NMOS transistor 104 receives an inverse version of the INPUT which is designated INPUTn. These gate signals are inverse versions in that when the INPUT signal is high, the INPUTn and INPUTp versions are low, and when the INPUT signal is low, the INPUTn and INPUTp versions are high. For a class B output drive, INPUTp may be the same as INPUTn. For a class AB output drive, INPUTp may be offset from INPUTn by a constant voltage. Output drive circuits of this type are described in the literature (see, for example, Adel S. Sedra and Kenneth C. Smith, "Output Stages and Power Amplifiers," Chapter 10 of *Microelectronic Circuits*, pp. 548–598 (1987)).

Figure 2:
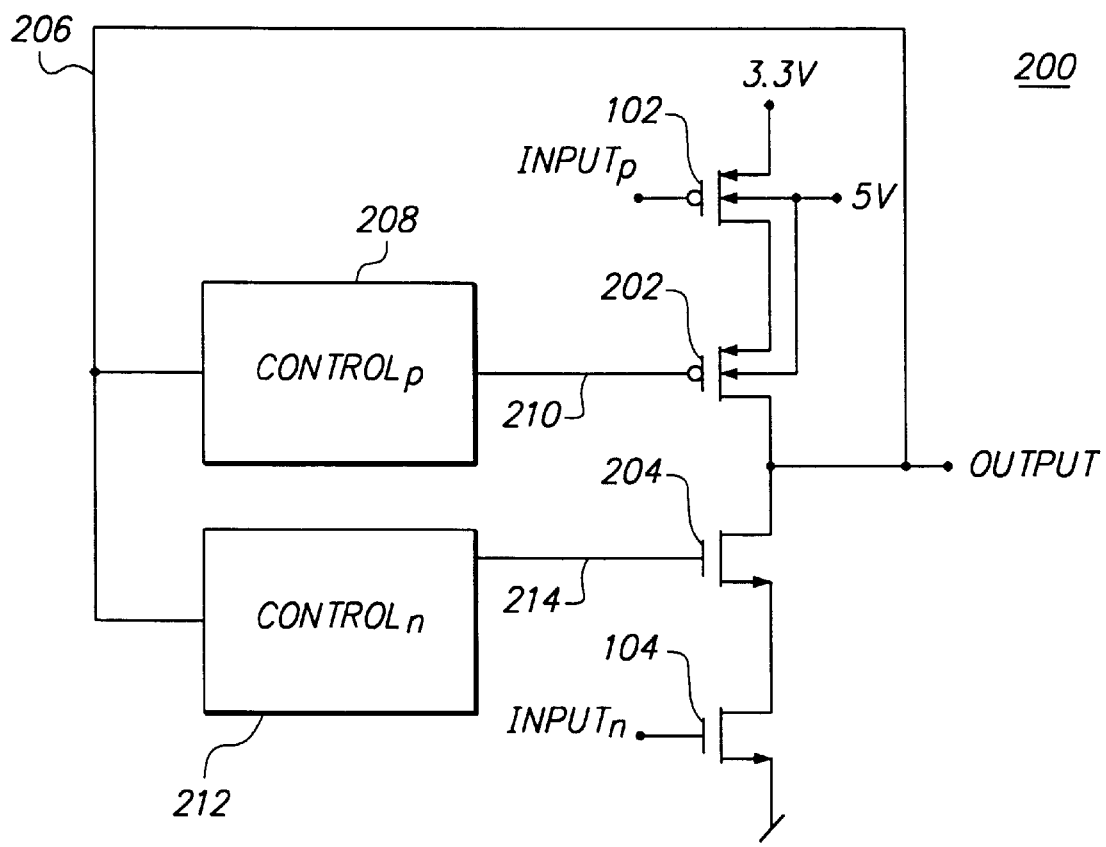
FIG. 2 is a diagram of an output drive circuit 200 according to one embodiment of this invention.

FIG. 2 is a diagram of an output drive circuit 200 according to one embodiment of this invention in which, in additional to the elements of the conventional drive 100, a second PMOS transistor 202 is coupled between the first PMOS transistor 102 and the OUTPUT node, and a second NMOS transistor 204 is coupled between the first NMOS transistor 104 and the OUTPUT node.

The gate of the second PMOS transistor 202 is coupled via line 210 to a first control circuit designated CONTROLp 208 that is coupled to the OUTPUT node via line 206. The CONTROLp circuit 208 is described in further detail below with reference to FIG. 3.

The gate of the second NMOS transistor 204 is coupled via line 214 to a second control circuit designated CONTROLn 212. The CONTROLn circuit 212 is also coupled to the OUTPUT node via line 206 and is described in further detail below in relation to FIG. 4.

In addition, the output drive circuit 200 includes the coupling of a 5 volt source to the substrates of the first and second PMOS transistors 102 and 202.

Figure 3:
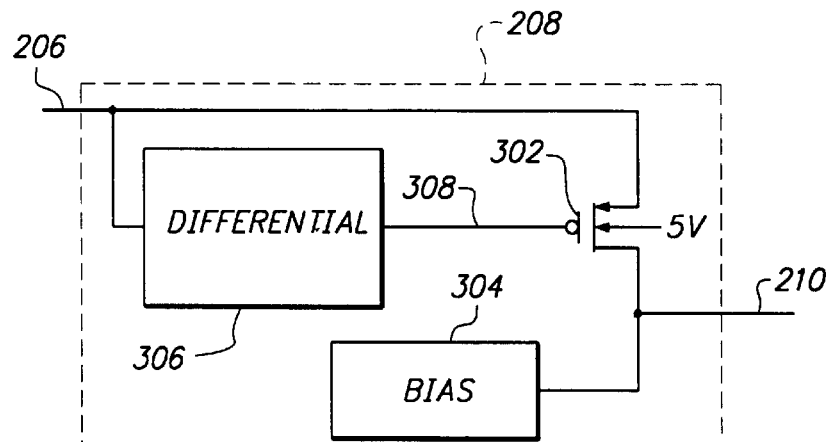
FIG. 3 is a diagram of the first control circuit designated as CONTROLp 208 within the output drive circuit 200 of FIG. 2.

FIG. 3 is a diagram of the first control circuit designated as CONTROLp 208 within the output drive circuit 200 according to one embodiment of this invention. The CONTROLp circuit 208 comprises a third PMOS transistor 302, a BIAS circuit 304, and a DIFFERENTIAL circuit 306.

The third PMOS transistor 302 has its drain coupled to line 210 (which couples to the gate of the second PMOS transistor 202), its source coupled to line 206 (which couples to the OUTPUT node), its gate coupled to line 308 which couples to the DIFFERENTIAL circuit 306, and its substrate coupled to a 5 volt source.

Like the drain of the third PMOS transistor 302, the BIAS circuit 304 also couples to line 210 (which couples to the gate of the second PMOS transistor 202).

Like the source of the third PMOS transistor 302, the DIFFERENTIAL circuit also couples to line 206 (which couples to the OUTPUT node). As described above, the DIFFERENTIAL circuit 306 also couples to line 308 which couples to the gate of the third PMOS transistor 302.

Figure 4:
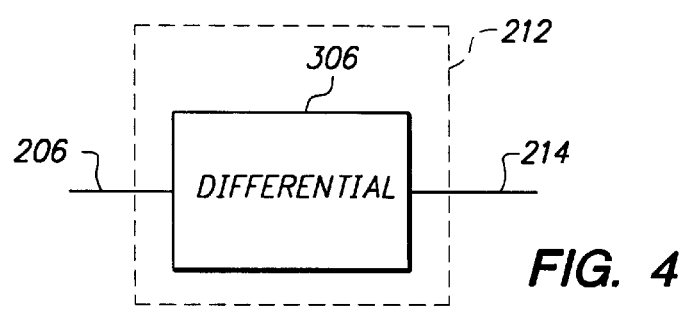
FIG. 4 is a diagram of the second control circuit designated as CONTROLn 212 within the output drive circuit 200 of FIG. 2.

FIG. 4 is a diagram of the second control circuit designated as CONTROLn 212 within the output drive circuit 200 according to an embodiment of this invention. The CONTROLn circuit 212 comprises a DIFFERENTIAL circuit 306 which is coupled to line 206 (which couples to the OUTPUT node) and is coupled to line 214 (which couples to the gate of the second NMOS transistor 204). In one embodiment of this invention, the DIFFERENTIAL circuit 306 within the CONTROLn circuit 212 is substantially the same as the DIFFERENTIAL circuit 306 within the CONTROLp circuit 208.

Figure 5:
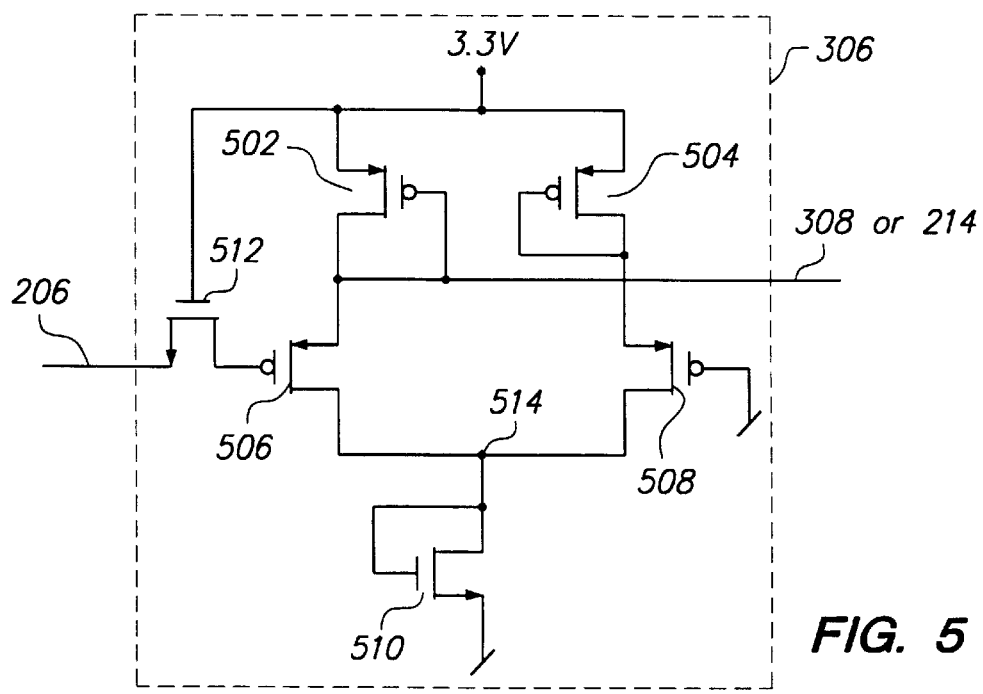
FIG. 5 is a circuit diagram of the DIFFERENTIAL circuit 306 in an embodiment of this invention.

FIG. 5 is a circuit diagram of the DIFFERENTIAL circuit 306 in an embodiment of this invention. The DIFFERENTIAL circuit 306 comprises four PMOS transistors 502, 504, 506, and 508, two NMOS transistors 510 and 512, and a node 514.

PMOS transistor 502 has its drain and gate coupled to line 308 or 214 (depending upon whether the DIFFERENTIAL circuit 306 is within the CONTROLp circuit 208 or the CONTROLn circuit 212), and its source coupled to a 3.3 volt source. PMOS transistor 504 has its drain and gate coupled to the source of PMOS transistor 508, and its source coupled to a 3.3 volt source. PMOS transistor 506 has its source coupled to line 308 or 214, its drain coupled to the node 514, and its gate coupled to the drain of NMOS transistor 512. PMOS transistor 508 has its source coupled to the drain and gate of PMOS transistor 504, its drain coupled to the node 514, and its gate coupled to a ground.

NMOS transistor 510 has its drain and gate coupled to the node 514, and its source coupled to ground. Finally, NMOS transistor 512 has its drain coupled to the gate of PMOS transistor 506, its source coupled to line 206 (which couples to the OUTPUT node), and its gate coupled to a 3.3 volt source. The node 514 couples to the drain of PMOS transistor 506, the drain of PMOS transistor 508, and the gate and drain of NMOS transistor 510.

Figure 6:
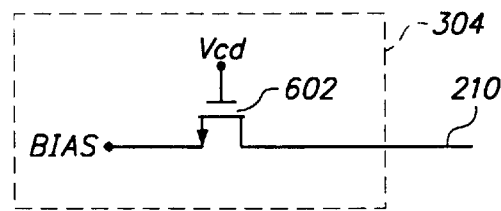
FIG. 6 is a circuit diagram of the BIAS circuit 304 within the CONTROLp circuit 208 of FIG. 2.
Figure 9:
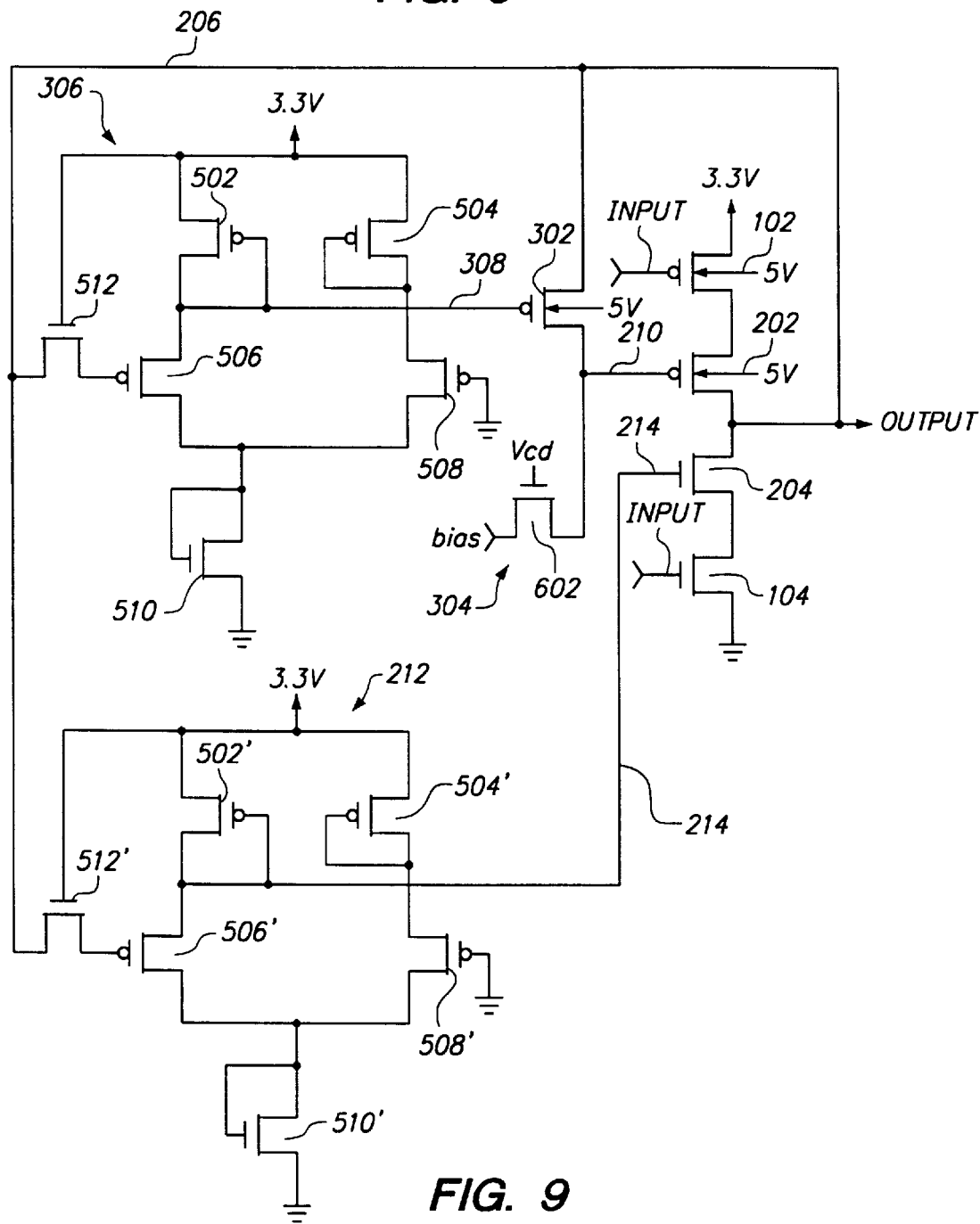
FIG. 9 is a diagram combining the circuitry shown in FIGS. 2–6.

FIG. 6 is a circuit diagram of the BIAS circuit 304 within the CONTROLp circuit 208. The BIAS circuit 304 comprises a NMOS transistor 602 that has its source coupled to a BIAS voltage source, its gate coupled to a voltage Vcd, and its drain coupled to the line 210 (which couples to the gate of the second PMOS transistor 202 and to the drain of the third PMOS transistor 302).

Vcd is applied to the gate of the NMOS transistor 602 with a magnitude and polarity that turns this transistor "on," and the voltage signal on line 210 is then similar to the voltage signal from the BIAS voltage source. The relationship between the BIAS voltage and the voltage signal on line 210 is illustrated in FIG. 7.

Figure 7:
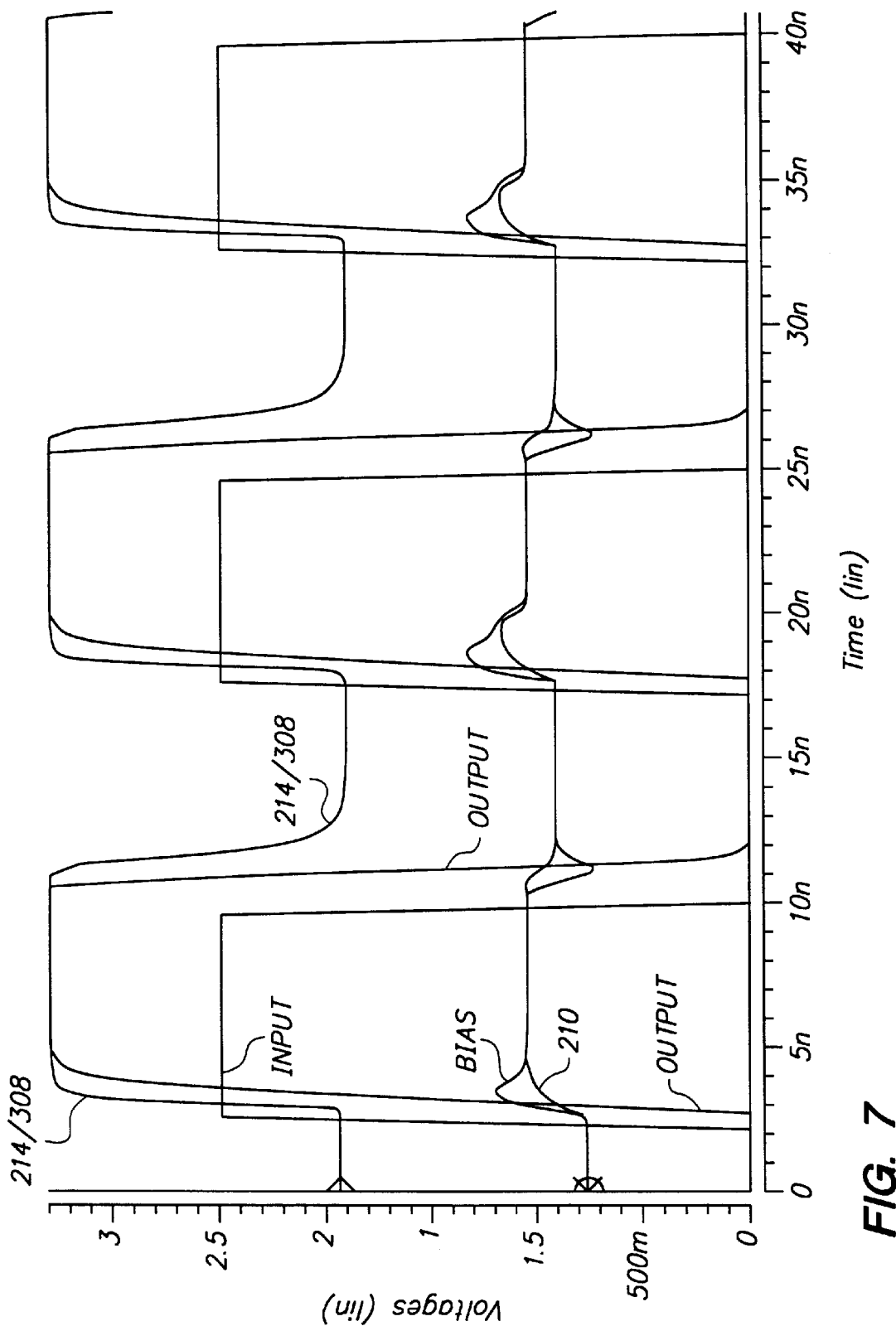
FIG. 7 is a timing diagram of the operation of the output drive circuit 200 of FIG. 2 in operation to produce an output signal in accordance with one embodiment of this invention.

FIG. 7 is a timing diagram of the operation of the output drive circuit 200 when operating to produce an output signal in accordance with an embodiment of this invention. FIG. 7 includes simulated traces of INPUT, OUTPUT, signals on lines 214/308, BIAS, and signals on line 210.

The INPUT trace represents the voltage signal whose inverted versions (INPUTp and INPUTn) are applied to the gates of the first PMOS and NMOS transistors 102 and 104, respectively. The INPUT trace is the input signal for the output drive circuit 200. The INPUT varies from about 2.5 volts when high to 0 volts when low. When INPUT is high, the first PMOS transistor 102 is turned "on," and the 3.3 volt supply voltage is transmitted from the source to drain of the first PMOS transistor 102, and the first NMOS transistor 104 is turned "off." On the other hand, when INPUT is low, the first NMOS transistor 104 is turned "on" to transfer ground (zero volts) from the drain to the source of the first NMOS transistor 104, and the first PMOS transistor 102 is turned "off."

The OUTPUT trace represents the voltage signal (on line 206) which is produced by the output drive circuit 200 in response to the INPUT signal. The OUTPUT signal generally follows the INPUT signal (by about 1 nanosecond delay), but the OUTPUT is about 3.3 volts when high and about 0 volts when low. Thus, the output drive circuit 200 is called a 3.3 volt output drive.

The 214/308 trace represents the output of the two DIFFERENTIAL circuits 306, one within the CONTROLp circuit 208 and another within the CONTROLn circuit 212. Each of the DIFFERENTIAL circuits 306 receives as input the OUTPUT signal on line 206. The output of DIFFERENTIAL circuit 306 is generally high (3.3 volts) on either line 214 or 308 when its input is high (3.3 volts), and the output is generally relatively low (about 2 volts) when its input is low (zero volts). As illustrated in FIG. 7, the 214/308 trace rises slightly after INPUT trace rises and falls soon after the OUTPUT trace falls.

When the INPUT signal is low, the voltage on line 214 is about 2 volts, so the second NMOS transistor 204 is "on." Since the first NMOS transistor 104 is also "on" when INPUT is low, the OUTPUT signal is pulled down to zero volts. Since the voltage on line 214 is at only about 2 volts when the OUTPUT signal is at zero volts, the second NMOS transistor 204 is kept within its operating limitations. The manufacturing process of the integrated circuit imposes certain design rule limitations on the transistors. In one embodiment, the design rule limitations include that the voltage difference from gate to source of the transistors (Vgs) must be less than 3.0 volts in magnitude and the voltage difference from drain to source (Vds) must be less than 3.3 volts in magnitude.

When the INPUT signal is high, the voltage on line 308 is about 3.3 volts, so the third PMOS transistor 302 is "off." As a result, the voltage on line 210 is determined by the gated bias voltage signal that is produced by the BIAS circuit 304 on the line 210. The voltage on line 308, which falls to about 2 volts when the OUTPUT signal is being pulled down to zero volts, enables the third PMOS transistor 302 to keep within its operating limitations since line 206 is at zero volts while the third PMOS transistor 302 is still "off."

The 210 trace in FIG. 7 represents the voltage signal on line 210. This voltage signal is applied to the gate of the second PMOS transistor 202. During normal buffer operation, the gated bias voltage is such that the line 210 is near 1 volt.

Since the voltage signal on line 210 is only about 1 volt, the second PMOS transistor 202 is "on." Since the first PMOS transistor 102 is also "on" when INPUT is high, the OUTPUT signal is pulled up to 3.3 volts. Since the voltage signal on line 210 being at about 1 volt when the OUTPUT signal is being pulled up to 3.3 volts, the second PMOS transistor 202 is kept within its operating limitations.

Thus, when the output drive circuit 200 is producing an output signal, the states of the first PMOS transistor 102 and the first NMOS transistor 104 are allowed to determine the OUTPUT signal, while the various transistors of the circuit are kept within their operating limitations.

Figure 8:
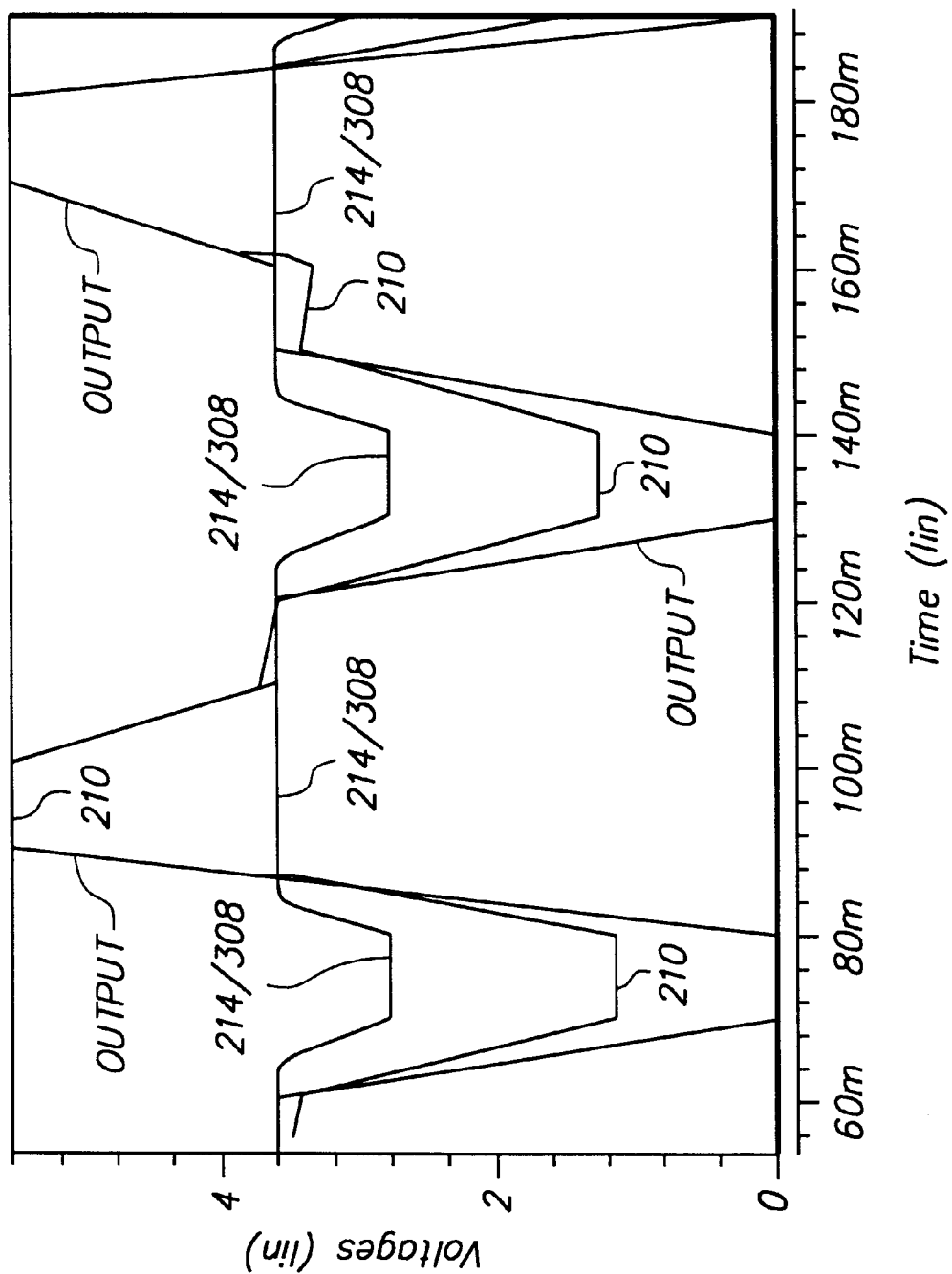
FIG. 8 is a timing diagram of the operation of the output drive circuit 200 during operation as a buffer (i.e. during tri-state) according to one embodiment of this invention.

FIG. 8 is a timing diagram of the operation of the output drive circuit 200 when operating as a tri-state buffer (i.e. during tri-state) in accordance with one preferred embodiment of this invention. FIG. 8 includes simulated traces of OUTPUT, signals on lines 214/308, and signals on line 210.

The OUTPUT trace represents a voltage signal on the OUTPUT node when it is being driven by a 5 V device coupled to the same PCI bus. The OUTPUT signal is shown as varying cyclically from 5.5 volts to 3 volts to 0 volts and so on.

The voltage signals on lines 214 and 308 (the 214/308 signal) are produced by the DIFFERENTIAL circuit 306. When the OUTPUT signal drops from 3 to zero volts, then the 214/308 signal drops to about 2.8 volts. When the OUTPUT signal rises to 5.5 volts, then the 214/308 signal rises to about 3.6 volts. And, when the OUTPUT signal goes from 5.5 to 3 volts, the 214/308 signal stays at about 3.6 volts.

When in tri-state buffer mode, the INPUTp signal is at 3.3 volts, and the INPUT n signal is at 0 volts. Therefore, both the first PMOS transistor 102 and the first NMOS transistor 104 are "off."

The variation of voltage on line 214 enables the second NMOS transistor 204 to keep within its operating limitations. For the second NMOS transistor 204, the OUTPUT signal is applied to its "drain," and the 214 signal is applied to its gate. When the OUTPUT signal is at 0 volts and the 214 signal is at 2.8 volts, then |Vgs|=2.8 volts<3.0 volts. When the OUTPUT signal is at 5.5 volts and the 214 signal is at 3.6 volts, then |Vgs|=2.9 volts<3.0 volts.

Similarly, the variation of voltage on line 308 enables the third PMOS transistor 302 to keep within its operating limitations. For the third PMOS transistor 302, the OUTPUT signal is applied to its "source" and the 308 signal is applied to its gate. When the OUTPUT signal is at 0 volts and the 308 signal is at 2.8 volts, then |Vgs|=2.8 volts<3.0 volts. On the other hand, when the OUTPUT signal is at 5.5 volts and the 308 signal is at 3.6 volts, then |Vgs|=2.9 volts<3.0 volts.

Lastly, the variation of voltage on line 210 enables the second PMOS transistor 202 to keep within its operating limiations. For the second PMOS transistor 202, the OUTPUT signal is applied to its "drain," and the 210 signal is applied to its gate. When the OUTPUT signal is at 0 volts and the 210 signal is at 1.2 volts, then |Vgs|=1.2 volts<3.0 volts. On the other hand, when the OUTPUT signal is at 5.5 volts and the 210 signal is also at 5.5 volts since the third PMOS transistor 302 is "on" as the 308 signal is at 3.6 volts, then |Vgs|=0 volts<3.0 volts.

We claim:

1. An output drive circuit for operation in at least two modes, including a first mode for outputting a relatively low-voltage oscillating signal to a bus system and a second mode in which the circuit operates as a tri-state buffer against a relatively high-voltage oscillating signal from the bus system, the output drive circuit comprising:

a first transistor being adapted to transmit the relatively low-voltage oscillating signal when the circuit is in the first mode and adapted to be tolerant of the relatively high-voltage oscillating signal when the circuit is in the second mode, wherein a first control signal is applied to a gate of the first transistor to keep the first transistor within operating limitations;

a second transistor being adapted to transmit the relatively low-voltage oscillating signal when the circuit is in the first mode and adapted to be tolerant of the relatively high-voltage oscillating signal when the circuit is in the second mode, wherein a second control signal is applied to a gate of the second transistor to keep the second transistor within operating limitations;

a first control circuit for generating the first control signal being adapted to receive the relatively low-voltage oscillating signal when the circuit is in the first mode and the relatively high-voltage oscillating signal when the circuit is in the second mode; and a second control circuit for generating the second control signal being adapted to receive the relatively low-voltage oscillating signal when the circuit is in the first mode and the relatively high-voltage oscillating signal when the circuit is in the second mode.

2. The circuit of claim 1, wherein the relatively low-voltage oscillating signal is less than 3.5 volts in magnitude, and the relatively high-voltage oscillating signal is more than 4.5 volts in magnitude.

3. The circuit of claim 1, wherein the first control circuit comprises a third transistor for transmitting the relatively-high voltage signal to a gate of the first transistor when the circuit is in the second mode.

4. The circuit of claim 3, wherein the first control circuit further comprises a bias circuit for transmitting a low voltage to the gate of the first transistor.

5. The circuit of claim 4, wherein the first control circuit further comprises a differential circuit for producing to a gate of the third transistor a first oscillating signal with a first offset voltage when the circuit is in the first mode and a second oscillating signal with a second offset voltage when the circuit is in the second mode.

6. The circuit of claim 1, wherein the second control circuit comprises a differential circuit for producing a first oscillating signal with a first offset voltage when the circuit is in the first mode and a second oscillating signal with a second offset voltage when the circuit is in the second mode.

7. A semiconductor circuit comprising:

a first PMOS transistor having a source coupled to a source of relatively low voltage source and having a gate adapted to receive a first input;

a second PMOS transistor having a source coupled to a drain of the first PMOS transistor, and having a gate adapted to receive a first control signal, and having a drain coupled to an output terminal;

a first NMOS transistor having a source coupled to a ground, and having a gate adapted to receive a second input;

a second NMOS transistor having a source coupled to a drain of the first NMOS transistor, having gate adapted to receive a second control signal, and having a drain coupled to the output terminal;

a first control circuit coupled to the output terminal for generating the first control signal; and a second control circuit coupled to the output terminal for generating the second control signal.

8. The circuit of claim 7, wherein the second control circuit comprises:

a differential circuit having an input coupled to the output terminal and having an output coupled to the gate of the second NMOS transistor.

9. The circuit of claim 7, wherein the first control circuit comprises:

a differential circuit having an input coupled to the output terminal;

a third PMOS transistor having a source coupled to the output terminal, having a gate coupled to an output of the differential circuit, and having a drain coupled to the gate of the second PMOS transistor; and a bias circuit having an output coupled to the gate of the second PMOS transistor.

* * * * *